(12) United States Patent
Lim

(10) Patent No.: US 7,084,675 B2
(45) Date of Patent: Aug. 1, 2006

(54) CIRCUIT AND METHOD OF GENERATING A BOOSTED VOLTAGE

(75) Inventor: Kyu-Nam Lim, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 119 days.

(21) Appl. No.: 10/818,692

(22) Filed: Apr. 6, 2004

(65) Prior Publication Data

US 2005/0013176 A1 Jan. 20, 2005

(30) Foreign Application Priority Data

Jul. 15, 2003 (KR) .................. 10-2003-0048433

(51) Int. Cl.
*G05F 1/575* (2006.01)
(52) U.S. Cl. .................. 327/78; 327/536; 365/198.09
(58) Field of Classification Search .................. None
See application file for complete search history.

(56) References Cited

U.S. PATENT DOCUMENTS

| 6,195,307 | B1 * | 2/2001 | Umezawa et al. .......... 365/226 |
| 6,281,716 | B1 * | 8/2001 | Mihara .......................... 327/80 |
| 6,373,325 | B1 * | 4/2002 | Kuriyama .................... 327/536 |
| 6,469,573 | B1 * | 10/2002 | Kanda et al. ................ 327/541 |
| 6,737,907 | B1 * | 5/2004 | Hsu et al. .................... 327/536 |
| 6,826,066 | B1 * | 11/2004 | Kozaru .......................... 365/52 |

* cited by examiner

*Primary Examiner*—Timothy P. Callahan
*Assistant Examiner*—Terry L Englund
(74) *Attorney, Agent, or Firm*—F. Chau & Associates, LLC

(57) ABSTRACT

Provided is a circuit and method of generating a boosted voltage while maintaining a constant difference between the boosted voltage and an array reference voltage when the array reference voltage is varied in a normal mode, a test mode, and a burn-in test mode of a semiconductor device. The boosted voltage generating circuit comprises a sensing signal generating circuit which generates a sensing signal, a pulse generating circuit which generates a driving signal in response to the sensing signal, and a pumping circuit which generates the boosted voltage in response to the driving signal to control a word line of a semiconductor device. The sensing signal generating circuit comprises a comparator which includes a first input terminal, a second input terminal for receiving a reference voltage, and an output terminal for outputting the sensing signal, a resistor coupled between the boosted voltage and the first input terminal, and a constant current source coupled between the first input terminal and a ground voltage.

14 Claims, 4 Drawing Sheets

CIRCUIT AND METHOD OF GENERATING A BOOSTED VOLTAGE

BACKGROUND OF THE INVENTION

1. Technical Field

The present invention relates to a semiconductor device, and more particularly, to a circuit and method of generating a boosted voltage while maintaining a constant difference between the boosted voltage and an array reference voltage.

2. Discussion of the Related Art

Dynamic random access memories (DRAMs) typically use a boosted voltage that has a higher value than that of an external power voltage to control word lines of memory cells in a memory cell array. An array reference voltage is commonly known as a reference voltage that is applied to the memory cell array and/or a peripheral circuit of the memory cell array.

When a rate of the boosted voltage is changed to be greater than that of the array reference voltage, in a general boosted voltage generating circuit, the boosted voltage rises to a high voltage level when in a test mode and a burn-in stress mode. Accordingly, transistors of the memory cells are required to bear the higher boosted voltage. Further, when applying a voltage stress to a device under test (DUT) at a wanted and/or desired array reference voltage, the DUT should be able to bear the additional stress caused by the higher boosted voltage.

However, as the array reference voltage that is used when applying a voltage stress is set to a lower voltage level than the wanted and/or desired voltage due to the higher boosted voltage, excess time is taken to test the DUT.

SUMMARY OF THE INVENTION

According to an aspect of the present invention, there is provided a boosted voltage generating circuit comprising: a sensing signal generating circuit which generates a sensing signal; a pulse generating circuit which generates a driving signal in response to the sensing signal; and a pumping circuit which generates a boosted voltage in response to the driving signal to control a word line of a semiconductor device. The boosted voltage generating circuit further comprises a bias voltage generating circuit for supplying a bias voltage to the sensing signal generating circuit. The sensing signal generating circuit comprises: a comparator having a first input terminal, a second input terminal for receiving a reference voltage, and an output terminal for outputting the sensing signal; a resistor coupled between the boosted voltage and the first input terminal; and a constant current source coupled between the first input terminal and a ground voltage.

The pulse generating circuit may be a ring-oscillator. In addition, the pulse generating circuit may be inactivated in response to the sensing signal in a first logic state, wherein the first logic state is a high logic state. The constant current source may be a negative-channel metal oxide semiconductor (NMOS) transistor that is gated in response to a bias voltage.

The comparator comprises: a first inverter; a second inverter which receives an output signal of the first inverter and outputs the sensing signal; a differential amplifier which amplifies a difference between a voltage of the first input terminal and the reference voltage; a switching circuit which is connected to a power voltage and an input terminal of the first inverter and is switched in response to an output signal of the differential amplifier; and a current source which is coupled between the input terminal of the first inverter and the ground voltage and is gated in response to the bias voltage. The switching circuit may be a positive-channel metal oxide semiconductor (PMOS) transistor. The current source may be an NMOS transistor, which is gated in response to the bias voltage applied to a gate of the current source.

According to another aspect of the present invention, there is provided a method of generating a boosted voltage to control a word line in a semiconductor device, the method comprising: comparing a first voltage with an array reference voltage and outputting a sensing signal as the result of the comparison; generating a driving signal in response to the sensing signal; and generating the boosted voltage in response to the driving signal, wherein the first voltage is equivalent to a difference between the boosted voltage and the array reference voltage, and the difference is constant. The difference may be generated by a resistor and a constant current flowing through the resistor.

According to yet another aspect of the present invention, a boosted voltage generating circuit for controlling a word line of a memory cell array in a semiconductor device comprises: a sensing signal generating circuit for generating a sensing signal, wherein a first voltage is compared to an array reference voltage prior to the transmission of the sensing signal; a pulse generating circuit for receiving the sensing signal and for generating a driving signal in response to the sensing signal; and a pumping circuit for generating a boosted voltage signal in response to the driving signal to control the word line of the memory cell array in the semiconductor device; wherein the first voltage, which is used to generate the sensing signal in conjunction with the array reference voltage, is equivalent or substantially similar to a voltage difference between the boosted voltage and the array reference voltage, wherein the voltage difference remains constant over a period of time. The sensing signal generating circuit may comprise a resistor and a current source for determining the voltage difference, wherein the voltage difference is maintained during a typical operation and/or a test mode of the semiconductor device.

BRIEF DESCRIPTION OF THE DRAWINGS

The features of the present invention will become more apparent by describing in detail exemplary embodiments thereof with reference to the attached drawings, in which.

DETAILED DESCRIPTION OF EXEMPLARY EMBODIMENTS

Figure 1:
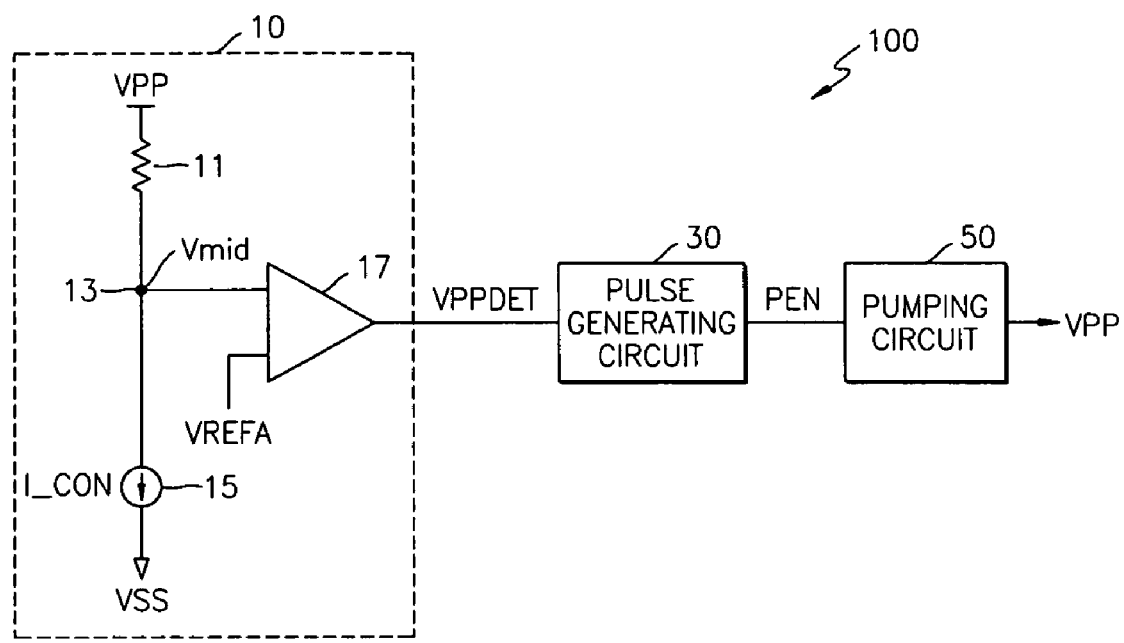
FIG. 1 is a block diagram of a boosted voltage generating circuit according to an exemplary embodiment of the present invention.

FIG. 1 is a block diagram of a boosted voltage generating circuit according to an exemplary embodiment of the present invention. Referring to FIG. 1, a boosted voltage generating circuit 100, which generates a boosted voltage VPP to control word lines of memory cells in, for example, a memory cell array of a semiconductor device, includes a sensing signal generating circuit 10, a pulse generating circuit 30, and a pumping circuit 50.

The sensing signal generating circuit 10 generates a sensing signal VPPDET, and the pulse generating circuit 30 generates a driving signal PEN in response to the sensing signal VPPDET. It is to be understood that the pulse generating circuit 30 may be a ring-oscillator. The pumping circuit 50 generates the boosted voltage VPP in response to the driving signal PEN to control the word lines of the memory cells in the semiconductor memory device.

The sensing signal generating circuit 10 includes a comparator 17, a resistor 11, and a constant current source 15. The comparator 17 includes a first input terminal connected to a node 13, a second input terminal for receiving an array reference voltage VREFA, and an output terminal for outputting the sensing signal VPPDET.

The resistor 11 is coupled between the boosted voltage VPP and the node 13, and the constant current source 15 is coupled between the node 13 and a ground voltage VSS. Accordingly, a constant difference (i.e., a voltage difference) is maintained between the boosted voltage VPP and the array reference voltage VREFA. The voltage difference is determined by the resistor 11 and a constant current I_CON flowing through the resistor 11.

Figure 2:
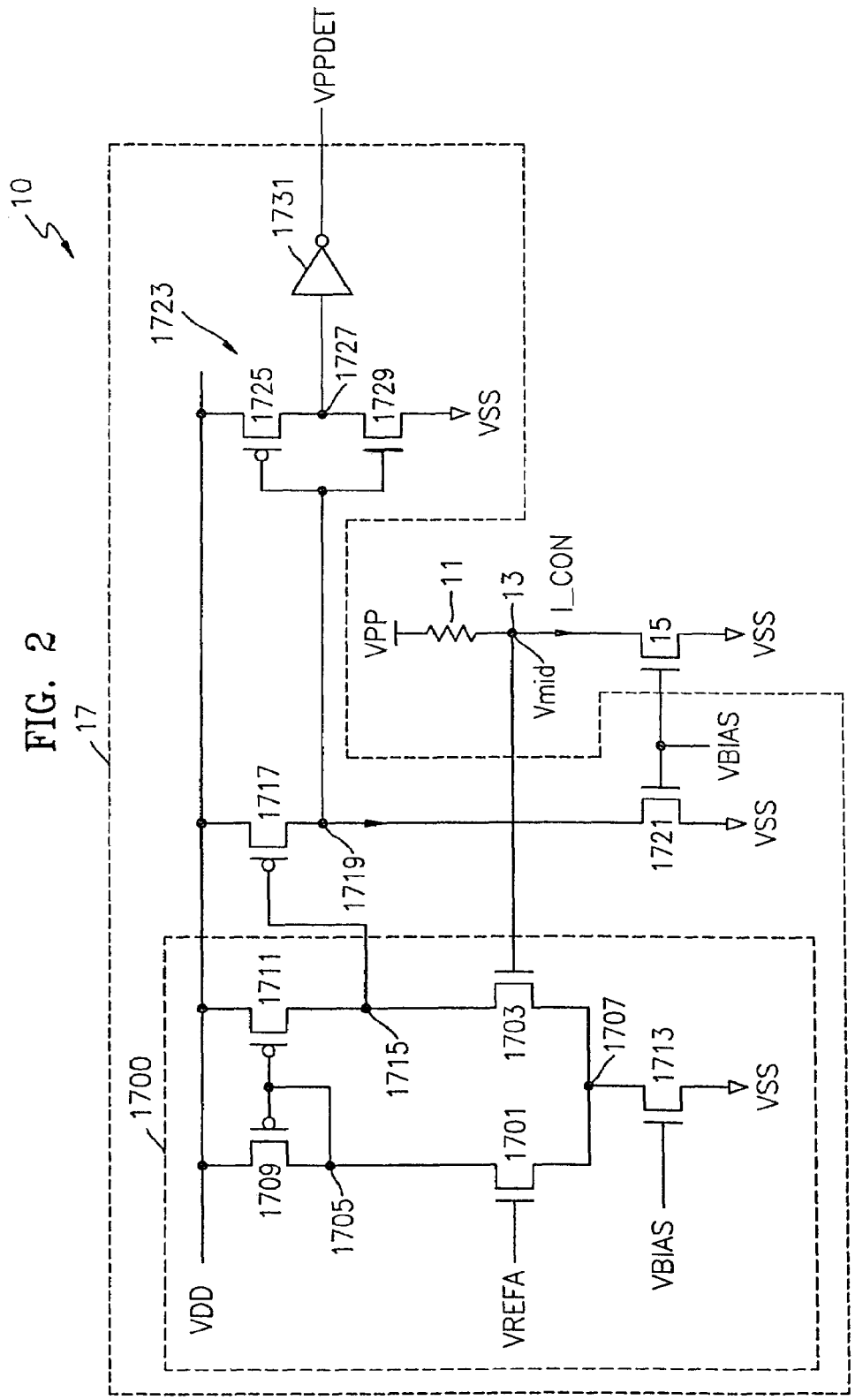
FIG. 2 is a circuit diagram illustrating a sensing signal generating circuit shown in FIG. 1.

FIG. 2 is a circuit diagram illustrating the sensing signal generating circuit 10 shown in FIG. 1. Referring to FIG. 2, the sensing signal generating circuit 10 includes the resistor 11, the constant current source 15, and the comparator 17.

The constant current source 15 may be a negative-channel metal oxide semiconductor (NMOS) transistor, which is coupled between the node 13 and the ground voltage VSS. A bias voltage VBIAS is input to a gate of the NMOS transistor 15. In the case where the bias voltage VBIAS is constant, the NMOS transistor 15 allows the flow of the constant current I_CON independent of an external power voltage VDD.

The comparator 17 includes a differential amplifier 1700, a switching circuit 1717, a first inverter 1723, a second inverter 1731, and a current source 1721.

The differential amplifier 1700 amplifies a difference between a voltage Vmid of the node 13, which is input to the first input terminal of the comparator 17, and the array reference voltage VREFA input to the second input terminal of the comparator 17, and outputs the result of the amplification to the switching circuit 1717.

An NMOS transistor 1701 is coupled between a node 1705 and a node 1707, and the reference voltage VREFA is input to a gate of the NMOS transistor 1701, namely, the second input terminal of the comparator 17. An NMOS transistor 1703 is coupled between a node 1715 and the node 1707, and a gate of the NMOS transistor 1703, namely, the first input terminal of the comparator 17, is connected to the node 13.

An NMOS transistor 1713 is coupled between the node 1707 and the ground voltage VSS, and the bias voltage VBIAS is input to a gate of the NMOS transistor 1713.

A positive-channel metal oxide semiconductor (PMOS) transistor 1709 is coupled between the node 1707 and the external power voltage VDD, and a gate of the PMOS transistor 1709 is connected to the node 1705. A PMOS transistor 1711 is coupled between the external power voltage VDD and the node 1715, and a gate of the PMOS transistor 1711 is connected to the node 1705.

The PMOS transistor 1709 and the PMOS transistor 1711 constitute a current mirror. It is to be understood that more than one terminal of the PMOS transistors 1709 and 1711 may be connected to the external power voltage VDD.

The switching circuit 1717 may be a PMOS transistor, which is coupled between the external power voltage VDD and a node 1719. A gate of the PMOS transistor 1717 is connected to the node 1715. The node 1715 is an output terminal of the differential amplifier 1700.

The current source 1721 may be an NMOS transistor, which is coupled between the node 1719 and the ground voltage VSS. The bias voltage VBIAS is input to a gate of the NMOS transistor 1721.

The first inverter 1723 includes one PMOS transistor 1725 and one NMOS transistor 1729. An input terminal of the first inverter 1723 is connected to the node 1719. An input terminal of the second inverter 1731 is connected to an output terminal 1727 of the first inverter 1723, and inverts an output signal of the first inverter 1723 and outputs the sensing signal VPPDET.

Figure 3:
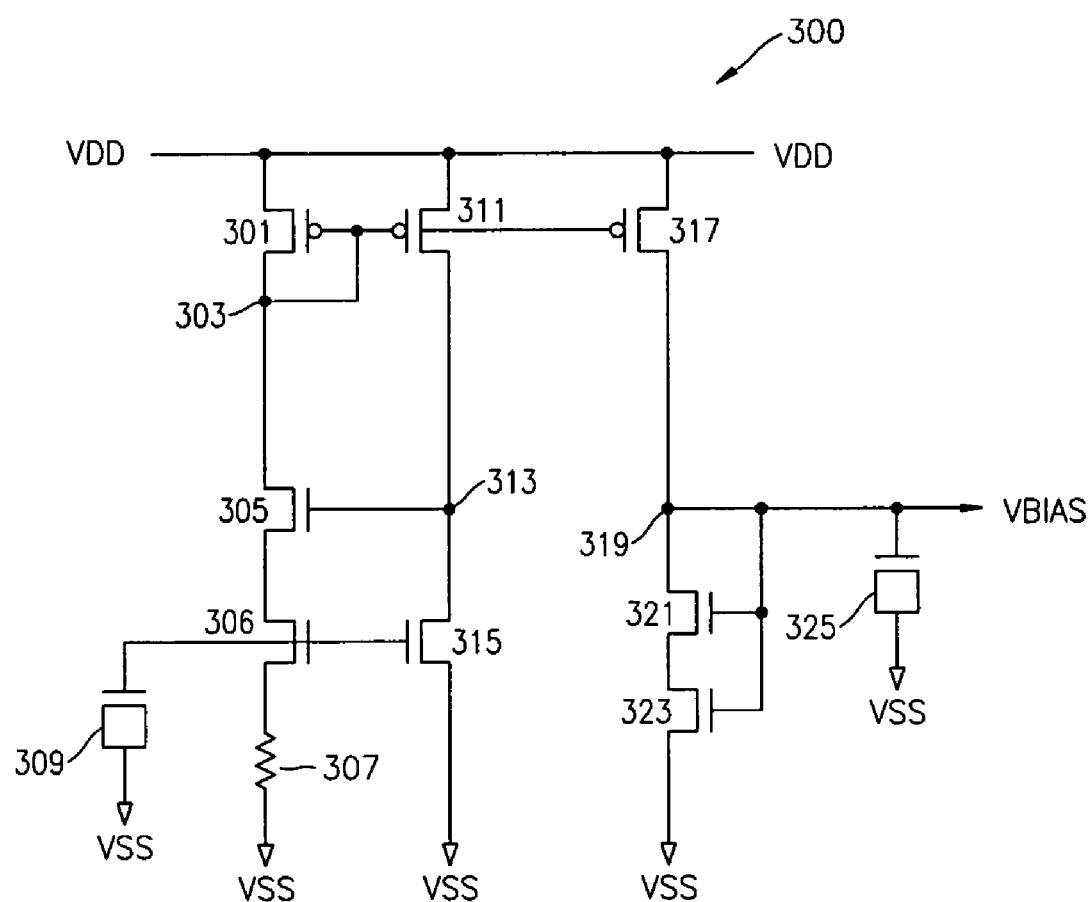
FIG. 3 is a circuit diagram of a bias voltage generating circuit.

FIG. 3 is a circuit diagram of a bias voltage generating circuit 300, which supplies a bias voltage VBIAS to the sensing signal generating circuit 10 shown in FIG. 2. The bias voltage generating circuit 300 generates the bias voltage VBIAS irrespective of changes in process, voltage, and temperature (PVT).

A PMOS transistor 301 is coupled between an external power voltage VDD and a node 303, and a PMOS transistor 311 is coupled between the external power voltage VDD and a node 313. Each of the PMOS transistors 301 and 311 has a gate connected to the node 303.

The node 303 is connected to a ground voltage VSS through NMOS transistors 305 and 306 and a resistor 307. A gate of the NMOS transistor 305 is connected to the node 313. An NMOS transistor 315 is coupled between the node 313 and the ground voltage VSS. Each of the NMOS transistors 306 and 315 has a gate connected to a gate of an NMOS transistor 309. The gate and a drain of the NMOS transistor 309 are connected to the ground voltage VSS.

A PMOS transistor 317 is coupled between the external power voltage VDD and a node 319. A gate of the PMOS transistor 317 is connected to the node 303. The node 319 is connected to the ground voltage VSS through NMOS transistors 321 and 323 which are connected in series.

Each of the NMOS transistors 321 and 323 has a gate connected to the node 319. A gate of an NMOS transistor 325 is connected to the node 319, and a drain and a source of the NMOS transistor 325 are connected to the ground voltage VSS. A voltage of the node 319 is the bias voltage VBIAS.

Figure 4:
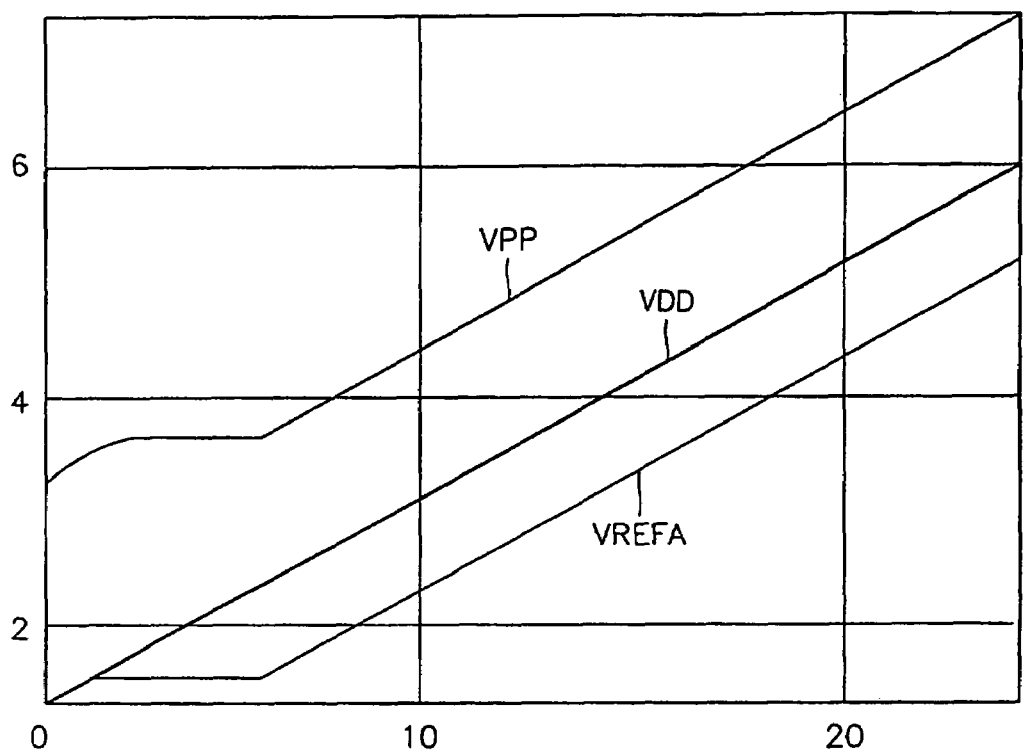
FIG. 4 is a graph illustrating a characteristic of an array reference voltage and a boosted voltage of the boosted voltage generating circuit of FIG. 1.

FIG. 4 is a graph illustrating characteristics of the array reference voltage VREFA and the boosted voltage VPP of the boosted voltage generating circuit 100 according to an exemplary embodiment of the present invention, when the resistor 11 has a resistance of 20 kΩ and the constant current I_CON 15 has a value of 100 μA. As shown in FIG. 4, a difference of 2V is present between the boosted voltage VPP and the array reference voltage VREFA.

Thus, even though the array reference voltage VREFA varies from being initially under 2V and rising to near 6V, a constant difference is maintained between the boosted voltage VPP and the array reference voltage VREFA by the boosted voltage generating circuit 100. In other words, a change in the rate of the array reference voltage VREFA is equal or substantially similar to a change in the rate of the boosted voltage VPP. Accordingly, over-stress resulting from the boosted voltage VPP decreases.

Thus, in a semiconductor device having the boosted voltage generating circuit 100, transistors of memory cells used in the semiconductor device can operate at a lower boosted voltage VPP and the current consumed by the semiconductor device decreases.

The operation of the boosted voltage generating circuit 100 according to an exemplary embodiment of the present invention will be explained with reference to FIGS. 1 through 4.

First, the bias voltage VBIAS is set to a value that is higher than a threshold voltage of each of the transistors 15, 1713, and 1721. When the voltage Vmid of the node 13 is higher than the bias voltage VBIAS, the amount of current flowing through the NMOS transistor 1703 is larger than the amount of current flowing through the NMOS transistor 1701. Further, when a voltage of the node 1715 is pulled down to the ground voltage VSS level, the node 1719 is pulled up to an external power voltage VDD level. Therefore, the sensing signal VPPDET becomes a signal having a logic value at a high state due to the operation of the inverters 1723 and 1731.

The pulse generating circuit 30 generates the driving signal PEN which is at an inactive state, e.g., a logic low state, in response to the sensing signal VPPDET which is at a logic high state, e.g., a first logic state. Because the pumping circuit 50 stops a pumping operation in response to the driving signal PEN at the inactive level, the boosted voltage VPP maintains a constant level.

However, when the voltage Vmid of the node 13 is lower than the bias voltage VBIAS, the amount of current flowing through the NMOS transistor 1701 is larger than the amount of current flowing through the NMOS transistor 1703. Further, when a voltage of the node 1705 is pulled down to the ground voltage VSS level, a voltage of the node 1715 is pulled up to an external power voltage VDD level by the PMOS transistor 1711. Thus, the PMOS transistor 1717 is turned off.

However, when the NMOS transistor 1721 pulls down a voltage of the node 1719 to the ground voltage VSS level in response to the bias voltage VBIAS, the sensing signal VPPDET becomes a signal having a logic low state by the operation of the inverters 1723 and 1731. The pulse generating circuit 30 then generates the driving signal PEN, i.e., pulsed driving signal, due to the sensing signal VPPDET of the logic low level and, since the pumping circuit 50 performs the pumping operation in response to the driving signal PEN, the boosted voltage VPP gradually increases.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A boosted voltage generating circuit comprising:
   a sensing signal generating circuit which generates a sensing signal;
   a pulse generating circuit which generates a driving signal in response to the sensing signal; and
   a pumping circuit which generates a boosted voltage in response to the driving signal to control a word line of a semiconductor device;
   wherein the sensing signal generating circuit comprises:
   a comparator having a first input terminal, a second input terminal for receiving a reference voltage, and an output terminal for outputting the sensing signal;
   a resistor coupled between the boosted voltage and the first input terminal of the comparator; and
   a constant current source coupled between the first input terminal of the comparator and a ground voltage,
   wherein when a voltage at the first input terminal of the comparator is higher than a bias voltage the sensing signal goes to a first logic state and the boosted voltage is maintained and when the voltage of the first input terminal of the comparator is lower than the bias voltage the sensing signal goes to a second logic state and the boosted voltage is increased.

2. The boosted voltage generating circuit of claim 1, further comprising: a bias voltage generating circuit for supplying the bias voltage to the sensing signal generating circuit.

3. The boosted voltage generating circuit of claim 1, wherein the pulse generating circuit is a ring-oscillator.

4. The boosted voltage generating circuit of claim 1, wherein the pulse generating circuit is inactivated in response to the sensing signal in the first logic state.

5. The boosted voltage generating circuit of claim 4, wherein the first logic state is a logic high state.

6. The boosted voltage generating circuit of claim 1, wherein the constant current source is a negative-channel metal oxide semiconductor (NMOS) transistor that is gated in response to the bias voltage.

7. A boosted voltage generating circuit comprising:
   a sensing signal generating circuit which generates a sensing signal;
   a pulse generating circuit which generates a driving signal in response to the sensing signal; and
   a pumping circuit which generates a boosted voltage in response to the driving signal to control a word line of a semiconductor device, wherein the sensing signal generating circuit comprises:
   a comparator for receiving a reference voltage and outputting the sensing signal, wherein the comparator comprises:
   a first inverter;
   a second inverter which receives an output signal of the first inverter and outputs the sensing signal;
   a differential amplifier which amplifies a difference between a voltage of a first input terminal of the comparator and the reference voltage;
   a switching circuit which is connected to a power voltage and an input terminal of the first inverter and is switched in response to an output signal of the differential amplifier; and
   a current source which is coupled between the input terminal of the first inverter and the ground voltage and is gated in response to a bias voltage.

8. The boosted voltage generating circuit of claim 7, wherein the switching circuit is a positive-channel metal oxide semiconductor (PMOS) transistor.

9. The boosted voltage generating circuit of claim 7, wherein the current source is an NMOS transistor, which is gated in response to the bias voltage applied to a gate of the current source.

10. A method of generating a boosted voltage to control a word line in a semiconductor device, the method comprising:
    comparing a first voltage with an array reference voltage and outputting a sensing signal as the result of the comparison;

generating a driving signal in response to the sensing signal; and generating the boosted voltage in response to the driving signal, wherein the first voltage is equivalent to a difference between the boosted voltage and the array reference voltage, and the difference is constant, wherein when the first voltage is higher than a bias voltage the sensing signal goes to a first logic state and the boosted voltage is maintained and when the first voltage is lower than the bias voltage the sensing signal goes to a second logic state and the boosted voltage is increased.

11. The method of claim 10, wherein the voltage difference is generated by a resistor and a constant current flowing through the resistor.

12. A boosted voltage generating circuit for controlling a word line of a memory cell array in a semiconductor device comprising:

a sensing signal generating circuit for generating a sensing signal, wherein a first voltage is compared to an array reference voltage prior to the transmission of the sensing signal;

a pulse generating circuit for receiving the sensing signal and for generating a driving signal in response to the sensing signal; and a pumping circuit for generating a boosted voltage signal in response to the driving signal to control the word line of the memory cell array in the semiconductor device;

wherein the first voltage, which is used to generate the sensing signal in conjunction with the array reference voltage, is equivalent or substantially similar to a voltage difference between the boosted voltage and the array reference voltage, wherein the voltage difference remains constant over a period of time, wherein when the first voltage is higher than a bias voltage the sensing signal goes to a first logic state and the boosted voltage is maintained and when the first voltage is lower than the bias voltage the sensing signal goes to a second logic state and the boosted voltage is increased.

13. The boosted voltage generating circuit of claim 12, wherein the sensing signal generating circuit comprises a resistor and a current source for determining the voltage difference.

14. The boosted voltage generating circuit of claim 12, wherein the voltage difference is maintained during a typical operation and/or a test mode of the semiconductor device.

* * * * *